(12) United States Patent
Sato et al.

(10) Patent No.: US 8,891,318 B2
(45) Date of Patent: Nov. 18, 2014

(54) SEMICONDUCTOR DEVICE HAVING LEVEL SHIFT CIRCUIT

(75) Inventors: Takenori Sato, Tokyo (JP); Yoji Idei, Tokyo (JP); Hiromasa Noda, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 284 days.

(21) Appl. No.: 13/286,665

(22) Filed: Nov. 1, 2011

(65) Prior Publication Data

US 2012/0134439 A1 May 31, 2012

(30) Foreign Application Priority Data

Nov. 30, 2010 (JP) ................................. 2010-266591

(51) Int. Cl.
| | |
|---|---|
| G11C 7/10 | (2006.01) |
| G11C 7/22 | (2006.01) |
| H03K 19/0175 | (2006.01) |
| G11C 11/4076 | (2006.01) |
| G11C 29/02 | (2006.01) |
| H03K 3/356 | (2006.01) |
| G11C 29/50 | (2006.01) |
| G11C 11/4093 | (2006.01) |

(52) U.S. Cl.
CPC .......... *G11C 7/1072* (2013.01); *G11C 11/4076* (2013.01); *G11C 7/1057* (2013.01); *G11C 29/025* (2013.01); *G11C 29/022* (2013.01); *H03K 3/356104* (2013.01); *G11C 7/222* (2013.01); *G11C 29/028* (2013.01); *G11C 29/50008* (2013.01); *G11C 11/4093* (2013.01); *G11C 7/1066* (2013.01)
USPC ............ 365/189.11; 365/189.05; 365/189.17; 365/198; 365/193; 365/233.1; 365/233.11; 365/233.12; 326/63; 326/81; 326/80; 327/333

(58) Field of Classification Search
CPC .... G11C 11/4085; G11C 5/145; G11C 5/147; G11C 7/12; G11C 8/08; H03K 19/00315; H03K 19/01806; H03K 19/018521; H03K 19/018528; H03K 19/018585; H03K 3/356113
USPC .......... 365/189.02, 189.11, 189.17, 191, 193, 365/198, 233.1, 233.11, 233.12, 233.13; 326/62, 63, 80, 81; 327/333
See application file for complete search history.

(56) References Cited

U.S. PATENT DOCUMENTS 6,333,895 B1 12/2001 Hamamoto et al.
6,975,557 B2 12/2005 D'Luna et al.
(Continued)

FOREIGN PATENT DOCUMENTS

| EP | 0 348 051 | 12/1989 |
|---|---|---|
| EP | 348051 A1 | 12/1989 |

(Continued)

OTHER PUBLICATIONS

Sato, U.S. Office Action mailed Jul. 24, 2013, directed to U.S. Appl. No. 13/290,541; 21 pages.

*Primary Examiner* — J. H. Hur

(57) ABSTRACT

A semiconductor device includes: two level shift circuits having substantially the same circuit configuration; an input circuit that supplies complementary input signals to the level shift circuits, respectively; and an output circuit that converts complementary output signals output from the level shift circuits into in-phase signals and then short-circuits the in-phase signals. According to the present invention, the two level shift circuits having substantially the same circuit configuration are used, and the complementary output signals output from the level shift circuits are converted into in-phase signals before short-circuited. This avoids almost any occurrence of a through current due to a difference in operating speed between the level shift circuits.

20 Claims, 16 Drawing Sheets

(56) References Cited

U.S. PATENT DOCUMENTS

| | | |
|---|---|---|
| 7,518,842 B2 | 4/2009 | Pilling et al. |
| 7,609,799 B2 | 10/2009 | Li |
| 7,888,966 B1 | 2/2011 | Davidson et al. |
| 7,969,184 B1 | 6/2011 | Redgrave |
| 8,254,153 B2 | 8/2012 | Dono et al. |
| 8,290,109 B2 | 10/2012 | Li |
| 8,330,488 B1 | 12/2012 | Redgrave |
| 8,358,556 B2 | 1/2013 | Hayashi |
| 8,362,827 B2 | 1/2013 | Takahashi et al. |
| 2003/0189477 A1 | 10/2003 | Schafer et al. |
| 2005/0073902 A1 | 4/2005 | D'Luna et al. |
| 2006/0066380 A1* | 3/2006 | Nomura ................ 327/333 |
| 2006/0077752 A1 | 4/2006 | D'Luna et al. |
| 2006/0261851 A1* | 11/2006 | Kim ................ 326/81 |
| 2007/0101177 A1 | 5/2007 | Kuroki |
| 2009/0201069 A1* | 8/2009 | Kim et al. ............ 327/333 |
| 2011/0062998 A1 | 3/2011 | Mitsubori et al. |
| 2012/0120705 A1 | 5/2012 | Mitsubori et al. |
| 2012/0133402 A1* | 5/2012 | Sato ................ 327/156 |
| 2012/0134439 A1 | 5/2012 | Sato et al. |

FOREIGN PATENT DOCUMENTS

| | | |
|---|---|---|
| JP | 07-193488 | 7/1995 |
| JP | H08-055480 | 2/1996 |
| JP | 11-136120 | 5/1999 |
| JP | 2000-124797 | 4/2000 |
| JP | 2000-163961 | 6/2000 |
| JP | 2001-110185 | 4/2001 |
| JP | 2001110185 | 4/2001 |
| JP | 2004-40262 | 2/2004 |
| JP | 200440262 | 2/2004 |
| JP | 2004-153689 | 5/2004 |
| JP | 2004153689 | 5/2004 |
| JP | 2005-158165 | 6/2005 |
| JP | 2006-333466 | 12/2006 |
| JP | 2008-301189 | 12/2008 |
| JP | 2010-062937 | 3/2010 |
| JP | 2010-073257 | 4/2010 |

* cited by examiner

US 8,891,318 B2

SEMICONDUCTOR DEVICE HAVING LEVEL SHIFT CIRCUIT

BACKGROUND OF THE INVENTION

1. Field of the Invention

The present invention relates to a semiconductor device, and more particularly to a semiconductor device that includes a level shift circuit.

2. Description of Related Art

Semiconductor devices such as a dynamic random access memory (DRAM) include various types of peripheral circuits that operate on an internal power supply voltage lower than an external power supply voltage in order to reduce power consumption. In such a case, there is a difference in amplitude between an internal data signal and an external data signal. A level shift circuit therefore needs to be inserted into the signal path so that the amplitude of the internal data signal is converted into that of the external data signal before the data is output to outside.

Converting a level of an internal data signal by using a level shift circuit may change the duty ratio of the internal data signal. The reason is that there is a difference between the rising time and falling time of the level shift circuit. To solve the problem, Japanese Patent Application Laid-Open Nos. 2004-40262 and 2004-153689 propose methods of connecting a pair of level shift circuits, which are opposite each other in conductivity types, in parallel.

In the level shift circuits described in Japanese Patent Application Laid-Open Nos. 2004-40262 and 2004-153689, in-phase output signals output from the pair of level shift circuits are short-circuited. Therefore, a through current can flow depending on a difference in operating speed between the pair of the level shift circuits. A level shift circuit has thus been desired that resolves the difference between the rising time and falling time and prevents the occurrence of a through current.

SUMMARY

In one embodiment, there is provided a semiconductor device comprising a level shift circuit unit that includes: first and second level shift circuits; an input circuit that supplies complementary input signals to the first and second level shift circuits, respectively; and an output circuit that converts complementary output signals supplied from the first and second level shift circuits into in-phase signals and short-circuits the in-phase signals.

BRIEF DESCRIPTION OF THE DRAWINGS

The above and the other features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
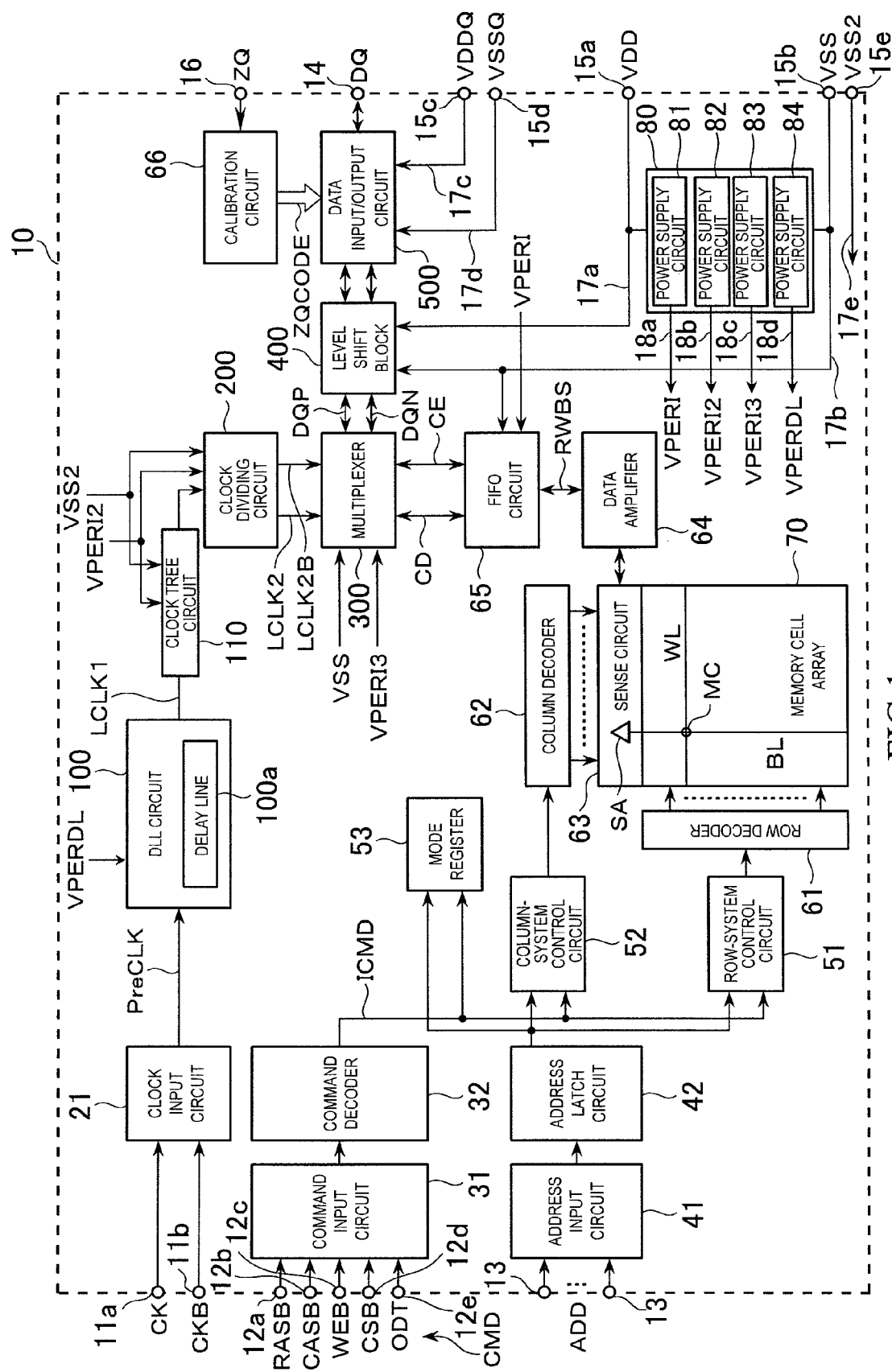
FIG. 1 is a block diagram showing the configuration of a semiconductor device 10 according to an embodiment of the present invention.

Referring now to FIG. 1, a semiconductor device 10 according to the present embodiment is a DDR (Double Data Rate) SDRAM (Synchronous DRAM). The semiconductor device 10 has external terminals including clock terminals 11a and 11b, command terminals 12a to 12e, address terminals 13, a data input/output terminal (data output terminal) 14, power supply terminals 15a to 15e, and a calibration terminal 16. The semiconductor device 10 also has other terminals such as a data strobe terminal and a reset terminal, which are omitted from the diagram. The terminals described above as well as circuit blocks constituting the DDR SDRAM are formed on a single semiconductor chip as the semiconductor device 10, as surrounded by a dotted line in FIG. 1. Further, each of the terminals may be also called "a pad" formed on the chip.

The clock terminals 11a and 11b are supplied with external clock signals CK and CKB, respectively. The supplied external clock signals CK and CKB are supplied to a clock input circuit 21. As employed herein, a signal having a signal name with a trailing "B" is either the inverted signal of a corresponding signal or a low-active signal. The external clock signals CK and CKB are thus mutually complementary signals. The clock input circuit 21 generates a single-phase internal clock signal PreCLK based on the external clock signals CK and CKB, and supplies the internal clock signal PreCLK to a DLL circuit 100. The DLL circuit 100 generates a phase-controlled internal clock signal LCLK1 based on the internal clock signal PreCLK, and supplies the internal clock signal LCLK1 to a clock dividing circuit 200 through a clock tree circuit 110. The clock dividing circuit 200 generates complementary internal clock signals LCLK2 and LCLK2B from the single-phase internal clock signal LCLK1, and supplies the complementary internal clock signals LCLK2 and LCLK2B to a multiplexer 300.

The command terminal 12a to 12e are supplied with a row address strobe signal RASB, a column address strobe signal CASB, a write enable signal WEB, a chip select signal CSB, and an on-die termination signal ODT, respectively. Such command signals CMD are supplied to a command decoder 32 through a command input circuit 31. The command decoder 32 generates various internal commands ICMD by holding, decoding, or counting the command signals. The internal commands ICMD are supplied to a row-system control circuit 51, a column-system control circuit 52, and a mode register 53.

The address terminals 13 are supplied with address signals ADD. The address signals ADD input to the address terminals 13 are supplied to an address latch circuit 42 through an address input circuit 41 to be latched in the address latch circuit 42. Among the address signals ADD latched in the address latch circuit 42, row addresses are supplied to the row-system control circuit 51. Column addresses are supplied to the column system control circuit 52. When entering a mode register set operation, the address signals ADD are supplied to the mode register 53, whereby contents of the mode register 53 are updated.

Output signals of the row-system control circuit 51 are supplied to a row decoder 61. The row decoder 61 selects any of word lines WL included in a memory cell array 70. The memory cell array 70 includes a plurality of word lines WL and a plurality of bit lines BL which intersect each other. Memory cells MC are arranged at the intersections (FIG. 1 shows only one of the word lines WL, one of the bit lines BL, and one of the memory cells MC). The bit lines BL are connected to corresponding sense amplifiers SA in a sense circuit 63.

The output signals of the column-system control circuit 52 are supplied to a column decoder 62. The column decoder 62 selects any of the sense amplifiers SA included in the sense circuit 63. The sense amplifiers SA selected by the column decoder 62 are connected to a data amplifier 64. In a read operation, the data amplifier 64 further amplifies read data that is amplified by the sense amplifiers SA, and supplies the read data to a FIFO circuit 65 through a read/write bus RWBS. In a write operation, the data amplifier 64 amplifies write data that is supplied from the FIFO circuit 65 through the read/write bus RWBS, and supplies the write data to sense amplifiers SA. As shown in FIG. 1, the FIFO circuit 65 is connected to the multiplexer 300. The FIFO circuit 65 constitutes a data transfer circuit for transferring data between the memory cell array 70 and the multiplexer 300.

The data input/output terminal 14 is an external terminal for outputting read data DQ to outside and receiving write data DQ from outside. The data input/output terminal 14 is connected to a data input/output circuit 500. The data input/output circuit 500 is connected to the multiplexer 300 through a level shift block 400. In a read operation, the data input/output circuit 500 drives the data input/output terminal 14 based on read data DQ that is supplied from the multiplexer 300 through the level shift block 400. While FIG. 1 shows only one data input/output terminal 14, the number of data input/output terminals 14 need not necessarily be one. There may be provided a plurality of data input/output terminals 14.

The data input/output circuit 500 is also connected to a calibration circuit 66. The calibration circuit 66 is connected to the calibration terminal 16, and functions to adjust the impedance of an output buffer included in the data input/output circuit 500. The calibration circuit 66 performs a calibration operation to generate an impedance code ZQCODE, and supplies the impedance code ZQCODE to the data input/output circuit 500. The data input/output circuit 500 changes the impedance of the output buffer based on the impedance code ZQCODE.

The impedance adjusting operation by the calibration circuit 66 is intended to prevent the impedance of the output buffer from deviating from a set value due to temperature changes or voltage variations. The set value of the impedance itself can be changed by a set value of the mode register 53.

The power supply terminals 15a and 15b are supplied with an external power supply potential VDD and a ground potential VSS, respectively. As employed herein, a voltage between the external power supply potential VDD and the ground potential VSS may be referred to simply as "external voltage VDD." The external voltage VDD is supplied to an internal voltage generating circuit 80. The internal voltage generating circuit 80 includes a plurality of power supply circuits 81 to 84, which generate respective internal power supply potentials VPERI, VPERI2, VPERI3, and VPERDL lower than the external power supply potential VDD. The internal power supply potentials VPERI, VPERI2, VPERI3, and VPERDL have the same level. As employed herein, a voltage between the internal power supply potential VPERI and the ground potential VSS may be referred to simply as "internal voltage VPERI." The same applies to VPERI2, VPERI3, and VPERDL.

The power supply terminals 15c and 15d are to be supplied with an external power supply potential VDDQ and a ground potential VSSQ, respectively. As employed herein, a voltage between the external power supply potential VDDQ and the ground potential VSSQ may be referred to simply as "external voltage VDDQ."

In the present embodiment, the external power supply potential VDDQ has the same level as that of the external power supply potential VDD. The ground potential VSSQ has the same level as that of the ground potential VSS. It should be noted that the power supply terminal 15a and 15c are separate terminals on the chip. A VDD line (high-potential power supply line) 17a that is connected to the power supply terminal 15a and a VDDQ line (high-potential power supply line) 17c that is connected to the power supply terminal 15c are also separate from each other, not being connected to each other in the chip. Similarly, a VSS line (low-potential power supply line) 17b that is connected to the power supply terminal 15b and a VSSQ line (low-potential power supply line) 17d that is connected to the power supply terminal 15d are separated from each other, not being connected to each other in the chip. Such separation of the power supply lines is intended to prevent power supply noise occurring due to the operation of the data input/output circuit 500 from propagating to other circuits. Since the data input/output circuit 500 passes a relatively high current for switching, the VDDQ line 17c and the VSSQ line 17d are designed to be lower than the VDD line 17a and the VSS line 17b in impedance. The lower impedance can be obtained by making the numbers of power supply terminals 15c and 15d greater than those of power supply terminals 15a and 15b.

The present embodiment also provides a power supply terminal 15e supplied with a ground potential VSS2. A VSS2 line 17e connected to the power supply terminal 15e is separated from the VSS line 17b and the VSSQ line 17d, being connected to neither of the lines in the chip.

The internal power supply potentials VPERI, VPERI2, VPERI3, and VPERDL are identical in level. A VPERI line 18a for supplying the internal power supply potential VPERI, a VPERI2 line 18b for supplying the internal power supply potential VPERI2, a VPERI3 line 18c for supplying the internal power supply potential VPERI3, and a VPERDL line 18d for supplying the internal power supply potential VPERDL are separated from each other, not being connected to each other in the chip. Again, such separation is intended to prevent an interaction among noises through the power supply lines. As employed herein, "power supply lines being separated" means not only that such line is not short-circuited, but also that transistors using these internal power supply potentials are formed in respective different wells and are thereby separated on a well level.

Figure 2:
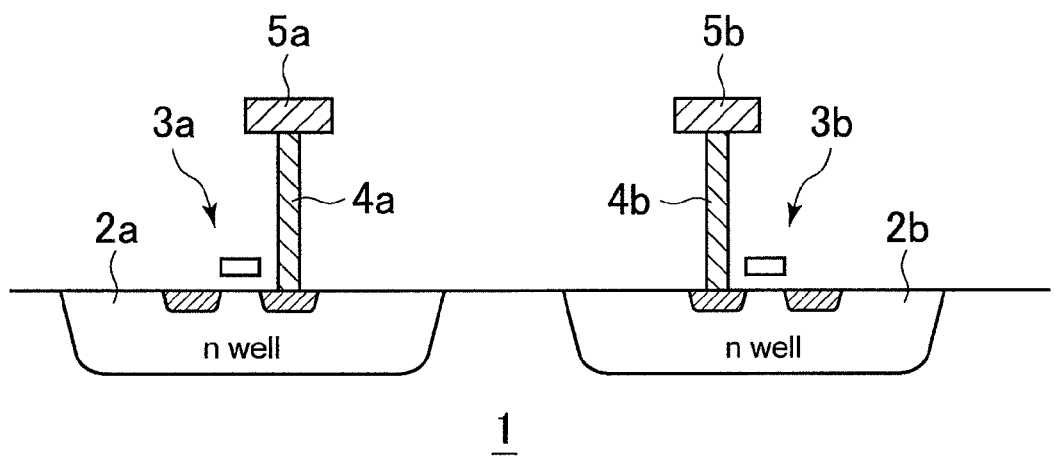
FIG. 2 is a schematic sectional view for explaining the separation on a well level.

Turning to FIG. 2, two mutually independent n-wells 2a and 2b are formed in a p-type silicon substrate 1. P-channel MOS transistors 3a and 3b are formed in the n-wells 2a and 2b, respectively. A source of the transistor 3a is connected to a power supply line 5a through a contact conductor 4a. Similarly, a source of the transistor 3b is connected to a power supply line 5b through a contact conductor 4b. Here, the power supply line 5a is any one of the VPERI line 18a, VPERI2 line 18b, VPERI3 line 18c, and VPERDL line 18d. The power supply line 5b is any one of the VPERI line 18a, VPERI2 line 18b, VPERI3 line 18c, and VPERDL line 18d other than the power supply line 5a. The internal power supply potentials VPERI, VPERI2, VPERI3, and VPERDL hardly affect each other by such separation on the well level even if these lines have the same potential level. It will be understood that the power supply circuits 81 to 84 that generate the internal power supply potentials VPERI, VPERI2, VPERI3, and VPERDL, respectively, are independent of each other. The power supply circuits 81 to 84 are also separated even in the internal voltage generation circuit 80.

As shown in FIG. 1, the VDD line 17a and the VSS line 17b are connected to the level shift block 400. The VDDQ line 17c and the VSSQ line 17d are connected to the data input/output circuit 500. Such connection means that the level shift block 400 operates on the voltage (external voltage VDD) between the external power supply potential VDD and the ground potential VSS, and the data input/output circuit 500 operates on the voltage (external voltage VDDQ) between the external power supply potential VDDQ and the ground potential VSSQ.

The VPERI2 line 18b is connected to the clock tree circuit 110 and the clock dividing circuit 200. The clock tree circuit 110 and the clock dividing circuit 200 thus operate on the internal power supply voltage VPERI2. The VPERI3 line 18c is connected to the multiplexer 300. The multiplexer 300 thus operates on the internal power supply voltage VPERI3. The VPERDL line 18d is connected to the DLL circuit 100. A delay line 100a included in the DLL circuit 100 operates on the internal power supply voltage VPERDL. Most of the other peripheral circuits are connected with the VPERI line 18a. Most of the peripheral circuits thus operate on the internal power supply voltage VPERI. For an example, FIG. 1 shows the internal power supply voltage VPERI being supplied to the FIFO circuit 65.

Since various types of internal circuits are driven by the internal power supply voltages VPERI and the like which are lower than the external power supply voltage VDD, it is possible to reduce power consumption. Incidentally, the memory cell array 70 also uses an array voltage (VARAY), a high voltage (VPP) which exceeds the external voltage VDD, and even a negative voltage (VKK). Such voltages are not directly relevant to the gist of the present invention, and description thereof will thus be omitted.

Figure 3:
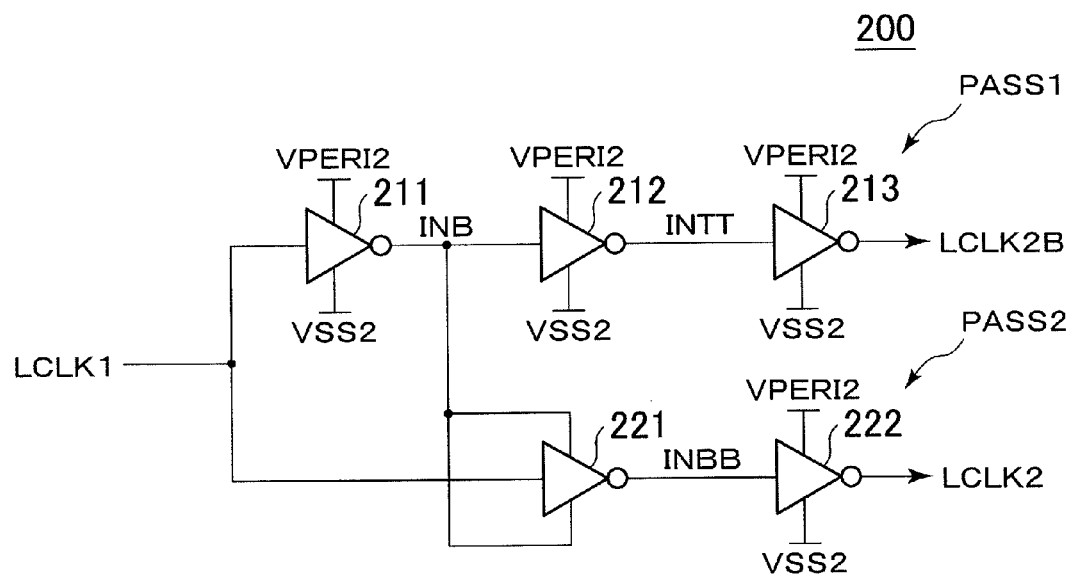
FIG. 3 is a circuit diagram of a clock dividing circuit 200 shown in FIG. 1.

Turning to FIG. 3, the clock dividing circuit 200 includes a signal path PASS1 that generates the internal clock signal LCLK2B from the internal clock signal LCLK1. The clock dividing circuit 200 also includes a signal path PASS2 that generates the internal clock signal LCLK2 from the internal clock signal LCLK1. The signal path PASS1 is to generate the internal clock signal LCLK2B which is reverse to the internal clock signal LCLK1 in phase. The signal path PASS1 includes three inverters 211, 212, and 213. The signal path PASS2 generates the internal clock signal LCLK2 which is in phase with the internal clock signal LCLK1. The signal path PASS2 includes two inverters 221 and 222. The number of stages of the logic circuits included in the signal path PASS1 is greater than that of the logic circuits included in the signal path PASS2 by one.

Among the inverters that constitute the clock dividing circuit 200, the inverters 211 to 213 and 222 operate with a voltage between the internal power supply potential VPERI2 and the ground potential VSS2 as the power source. The inverter 221 operates with an output signal of the inverter 211, or an inverted signal INB, as the power source. With such a configuration, a phase of an output signal of the inverter 212, or an internal signal INTT, coincides with a phase of an output signal of the inverter 221, or an internal signal INBB, even if the signal paths PASS1 and PASS2 have different numbers of logic stages. Hereinafter, the circuit configuration and operation of the clock dividing circuit 200 used in the present embodiment will be described in more detail.

Figure 4:
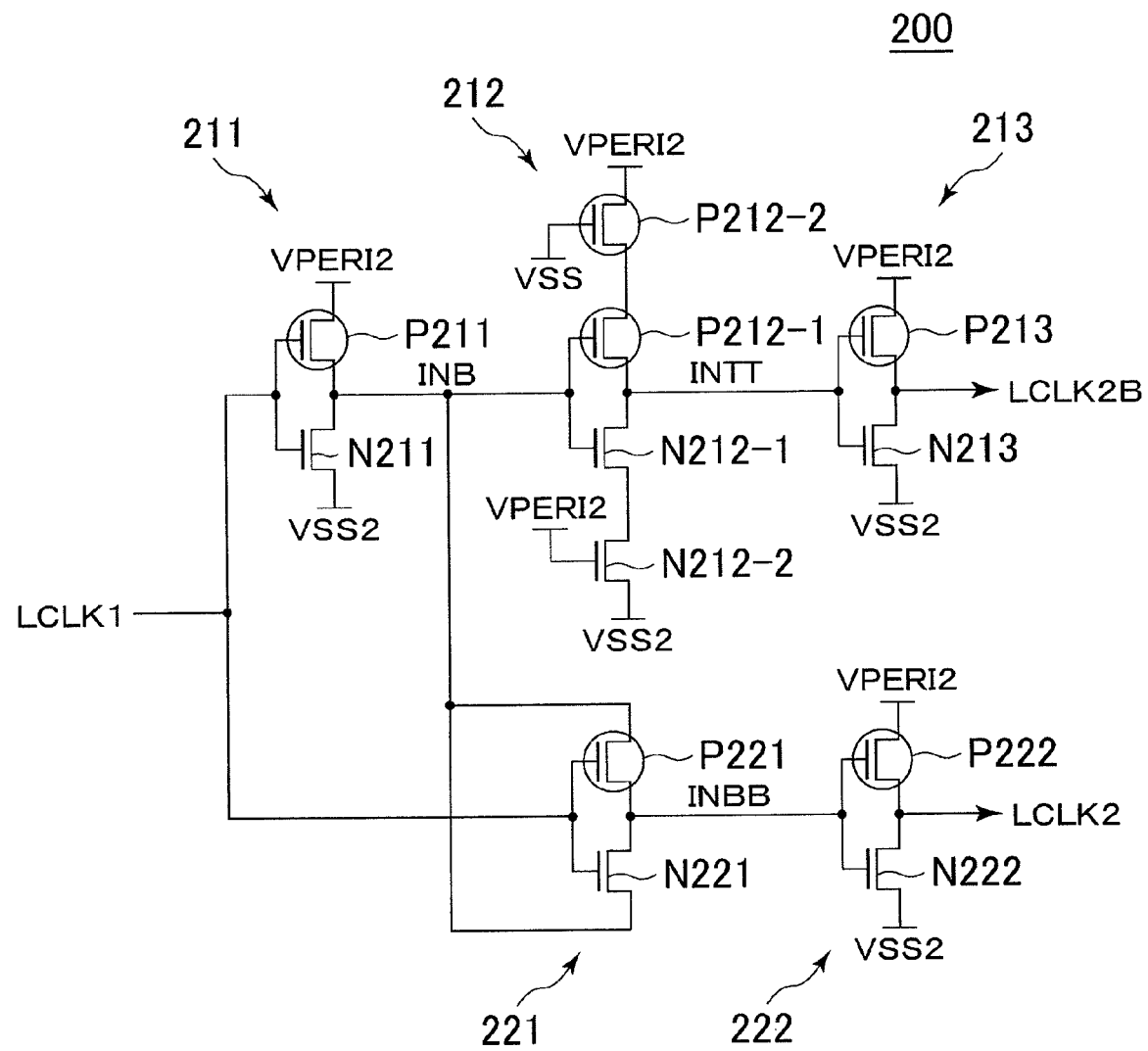
FIG. 4 is a detailed circuit diagram of the clock dividing circuit 200 shown in FIG. 3.

Turning to FIG. 4, the inverters each include a series circuit of P- and N-channel MOS transistors. Each individual inverter will be described in detail below.

The inverter 211 includes a series circuit of transistors P211 and N211. Sources of the transistors P211 and N211 are connected to the VPERI2 line 18b and the VSS2 line 17e, respectively. The internal clock signal LCLK1 is supplied to gate electrodes of the transistors P211 and N211 in common. An inverted signal INB is output from a common drain of the transistors P211 and N211.

The inverter 212 includes a series circuit of transistors P212-1 and N212-1. The inverted signal INB is supplied in common to gate electrodes of the transistors P212-1 and N212-1. The internal signal INTT is output from a common drain of the transistors P212-1 and N212-1. A transistor P212-2 is connected between a source of the transistor P212-1 and the VPERI2 line 18b. The ground potential VSS2 is supplied to a gate electrode of the transistor P212-2, whereby the transistor P212-2 is fixed to an ON state. A transistor N212-2 is connected between a source of the transistor N212-1 and the VSS2 line 17e. The internal power supply potential VPERI2 is supplied to a gate electrode of the transistor N212-2, whereby the transistor N212-2 is fixed to an ON state.

The inverter 213 includes a series circuit of transistors P213 and N213. Sources of the transistors P213 and N213 are connected to the VPERI2 line 18b and the VSS2 line 17e, respectively. The internal signal INTT is supplied to gate electrodes of the transistors P213 and N213 in common. The internal clock signal LCLK2B is output from a common drain of the transistors P213 and N213. The inverter 213 is to secure a fan-out. The provision of the inverter 213 is not indispensable in the present invention.

The inverter 221 includes a series circuit of transistors P221 and N221. Both sources of the transistors P221 and N221 are connected to an output end (common drain) of the inverter 211. The internal clock signal LCLK1 is supplied to gate electrodes in common of the transistors P221 and N221. The internal signal INBB is output from a common drain of the transistors P221 and N221.

The inverter 222 includes a series circuit of transistors P222 and N222. Sources of the transistors P222 and N222 are connected to the VPERI2 line 18b and the VSS2 line 17e, respectively. The internal signal INBB is supplied to gate electrodes of the transistors P222 and N222 in common. The internal clock signal LCLK2 is output from a common drain of the transistors P222 and N222. The inverter 222 is to secure a fan-out. The provision of the inverter 222 is not indispensable in the present invention.

In the present embodiment, the N-channel MOS transistors N211, N212-1, N212-2, and N221 are designed to have the same channel width. The N-channel MOS transistors N211, N212-1, N212-2, and N221 therefore have the same ON resistance. Similarly, the P-channel MOS transistors P211, P212-1, P212-2, and P221 are designed to have the same channel width. The P-channel MOS transistors P211, P212-1, P212-2, and P221 therefore have the same ON resistance. Since the N-channel MOS transistor(s) and the P-channel MOS transistor(s) that constitute an identical inverter are designed to have the same ON resistance, the transistors N211, N212-1, N212-2, N221, P211, P212-1, P212-2, and P221 have the same ON resistance.

Figure 5:
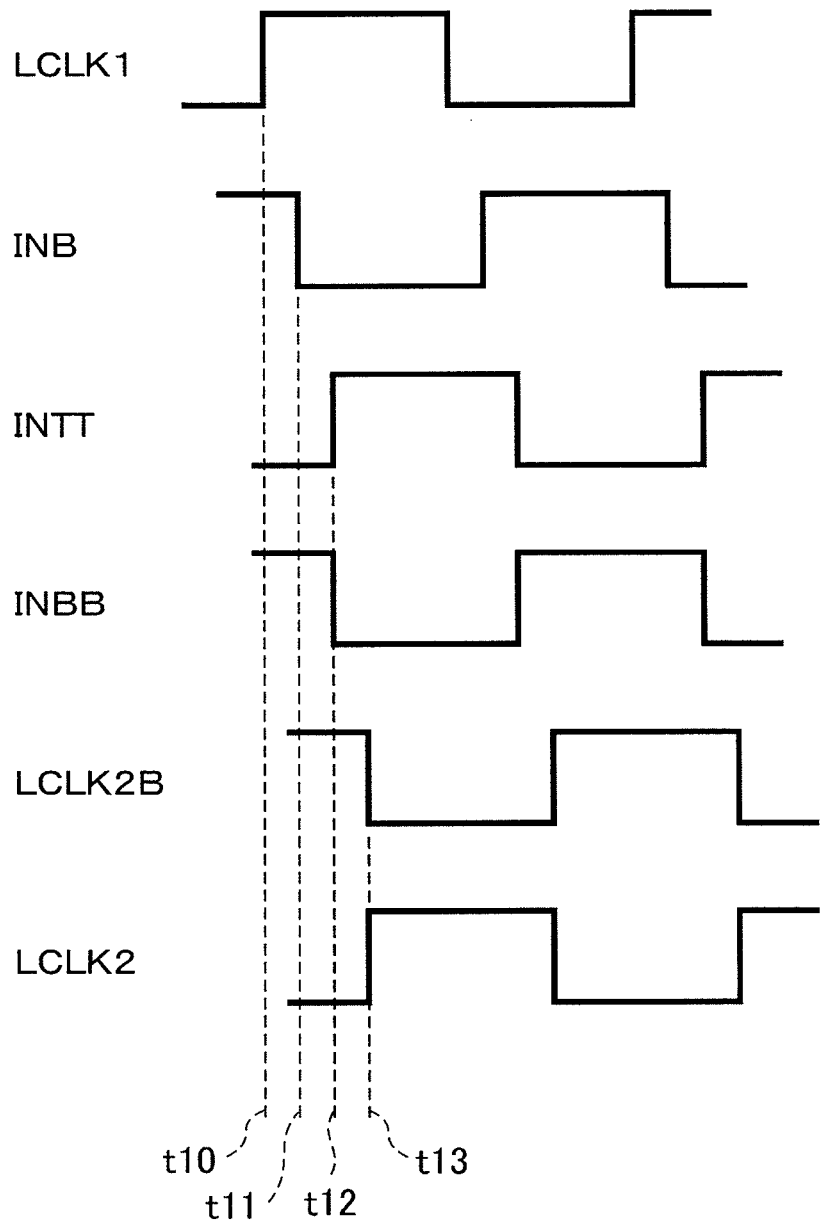
FIG. 5 is a waveform chart for explaining the operation of the clock dividing circuit 200 shown in FIG. 3.

Turning to FIG. 5, when the internal clock signal LCLK1 changes from a low level to a high level at time t10, the inverters 211 and 221 that receive the internal clock signal LCLK1 start to invert their outputs, the inverted signal INB and the internal signal INBB. Since the inverter 221 is powered by an output signal of the inverter 211, or the inverted signal INB, the inverter 221 is not able to invert the internal signal INBB (i.e., change the internal signal INBB to a low level) until the internal signal INB changes from a high level to a low level. At time t11, the inverted signal INB changes from a high level to a low level. At time t12, the internal signal INBB then changes from a high level to a low level.

Time t12 corresponds to a timing for respondent logic circuits in the next stage to make an inversion after the inverted signal INB changes from a high level to a low level. The output signal of the inverter 212, or the internal signal INTT, therefore also changes at time t12. That is, the inverters 212 and 221 simultaneously make a change at time t12. As a result, an output signal of the inverter 213, or the internal clock signal LCLK2B, and an output signal of the inverter 222, or the internal clock signal LCLK2, simultaneously make a change at time t13.

The same holds for the operation when the internal clock signal LCLK1 changes from a high level to a low level. The internal clock signals LCLK2 and LCLK2B eventually make a change at the same time.

The principle of the simultaneous changes of the output signal of the inverter 212, or the internal signal INTT, and the output signal of the inverter 221, or the internal signal INBB, will be described in more detail.

Initially, consider the case where the internal clock signal LCLK1 changes from a low level to a high level. In such a case, the transistor N211 included in the inverter 211 turns ON to change the inverted signal INB from a high level to a low level. This change has the following effects on the logic circuits in the next stage: For the inverter 212, the transistor P212-1 turns ON and an output end, or common drain, is connected to the VPERI2 line 18b through the transistors P212-2 and P212-1. Meanwhile, in the inverter 221, the transistor N221 turns ON and an output end, or common drain, is connected to the VSS2 line 17e through the transistors N211 and N221. Consequently, the internal signal INTT and the internal signal INBB always change at the same time if series resistance of the transistors P212-2 and P212-1 and series resistance of the transistors N211 and N221 are designed to be the same.

The same applies when the internal clock signal LCLK1 changes from a high level to a low level. In such a case, the transistor P211 included in the inverter 211 turns ON to change the inverted signal INB from a low level to a high level. This change has the following effects on the logic circuits in the next stage: For the inverter 212, the transistor N212-1 turns ON and an output end, or common drain, is connected to the VSS2 line 17e through the transistors N212-2 and N212-1. Meanwhile, in the inverter 221, the transistor P221 turns ON and an output end, or common drain, is connected to the VPERI2 line 18b through the transistors P211 and P221. Consequently, the internal signal INTT and the internal signal INBB always change at the same time if series resistance of the transistors N212-2 and N212-1 and series resistance of the transistors P211 and P221 are designed to be the same.

As described above, the clock dividing circuit 200 used in the present embodiment uses the signal on the signal path PASS1 as the power source of the inverter 221 which is included in the other signal path PASS2. Such a configuration allows precise matching of the pair of internal clock signals LCLK2 and LCLK2B in phase without adding a capacitor or resistor for adjustment. This eliminates the need to change masks repeatedly for the sake of modifying capacitance value or resistance value, thereby allowing a reduction in design cost.

Figure 6:
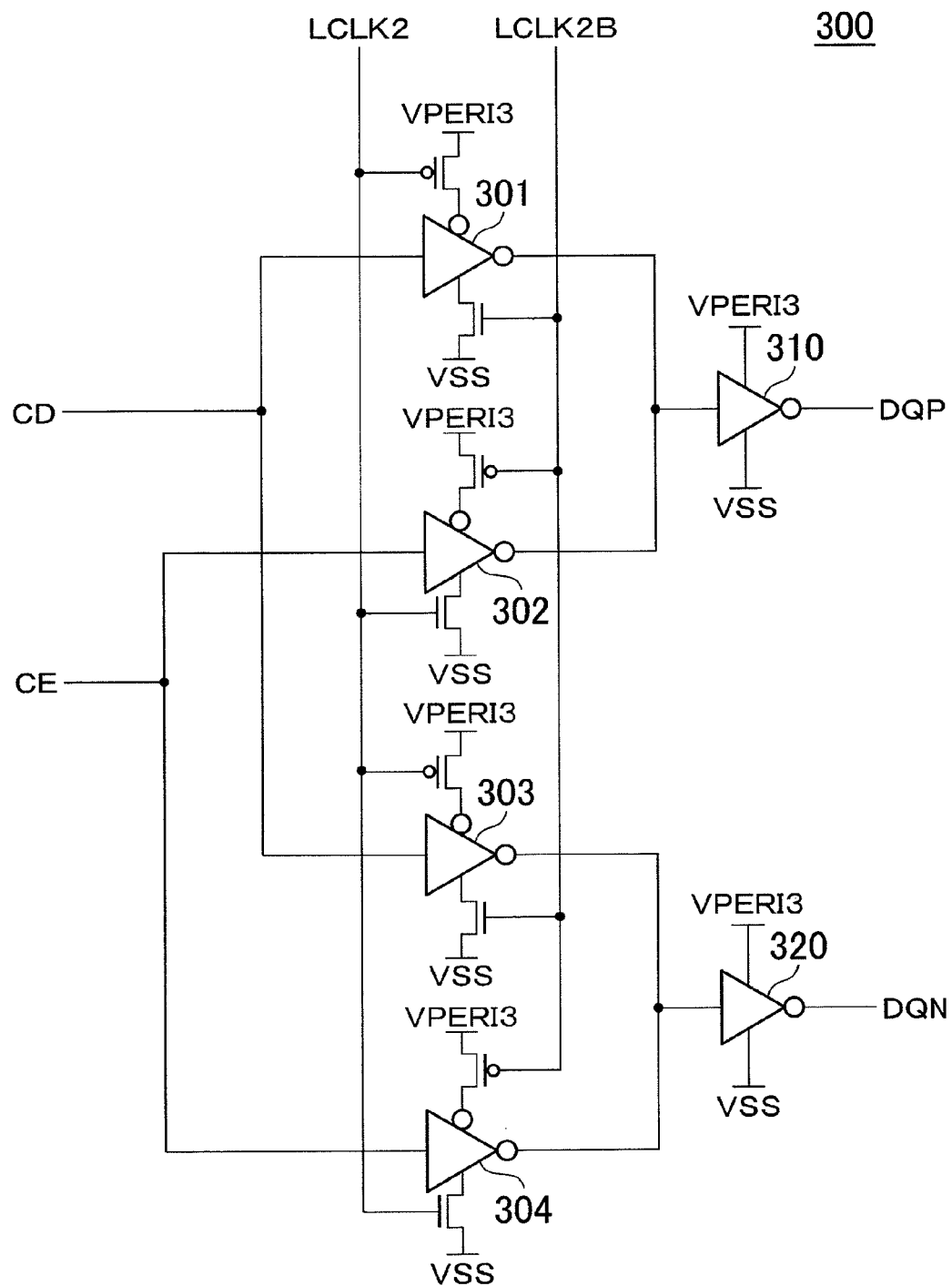
FIG. 6 is a circuit diagram of a multiplexer 300 shown in FIG. 1.

Turning to FIG. 6, the multiplexer 300 includes clocked drivers 301 to 304. The clocked drivers 301 and 303 output an internal data signal CD supplied from the FIFO circuit 65 in synchronization with a rising edge of the internal clock signal LCLK2. The clocked drivers 302 and 304 outputs an internal data signal CE supplied from the FIFO circuit 65 in synchronization with the rising edge of the internal clock signal LCLK2B. Output signals of the clocked drivers 301 and 302 are output as pull-up data DQP through an inverter 310. Outputs of the clocked drivers 303 and 304 are output as pull-down data DQN through an inverter 320.

All the clocked drivers 301 to 304 and the inverters 310 and 320 which constitute the multiplexer 300 operate on the internal power supply voltage VPERI3. That is, the high-level power supply nodes are connected to the VPERI3 line 18c. The low-level power supply nodes are connected to the VSS line 17b.

Figure 7:
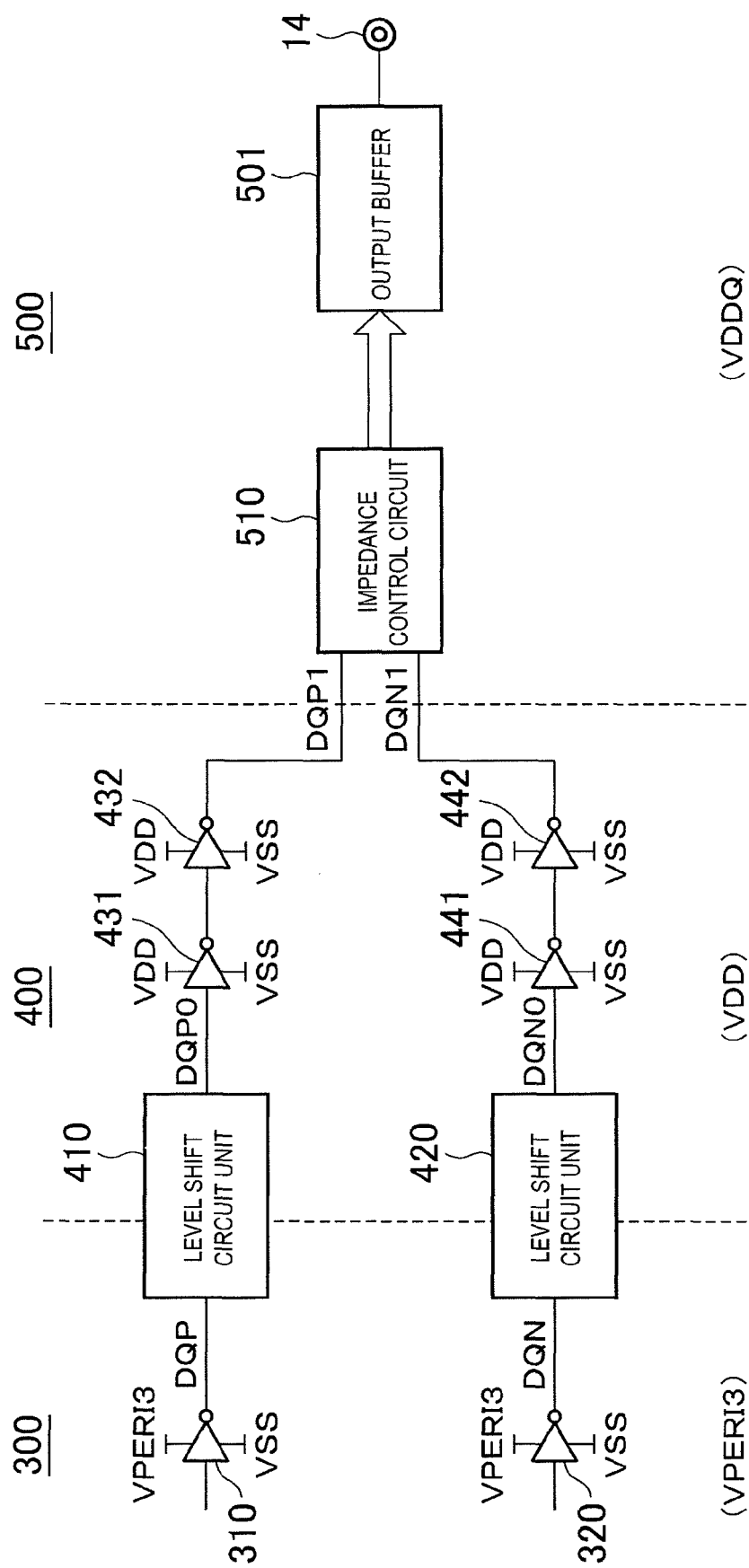
FIG. 7 is a block diagram of a level shift block 400 and a data input/output circuit 500 shown in FIG. 1.

Turning to FIG. 7, the level shift block 400 includes level shift circuit units 410 and 420. The level shift circuit unit 410 converts the amplitude of the pull-up data DQP from VPERI3 to VDD. The level shift circuit unit 420 converts an amplitude of the pull-down data DQN from VPERI3 to VDD. A level-converted pull-up data DQP0 from the level shift circuit unit 410 is supplied to the data input/output circuit 500 as pull-up data DQP1 through gate circuits 431 and 432. Similarly, the level-converted pull-down data DQN0 from the level shift circuit unit 420 is supplied to the data input/output circuit 500 as pull-down data DQN1 through gate circuits 441 and 442. Among the circuits that constitute the level shift block 400, the ones subsequent to the level shift circuit units 410 and 420 operate on a voltage between the external power supply potential VDD and the ground potential VSS (external voltage VDD).

Figure 8:
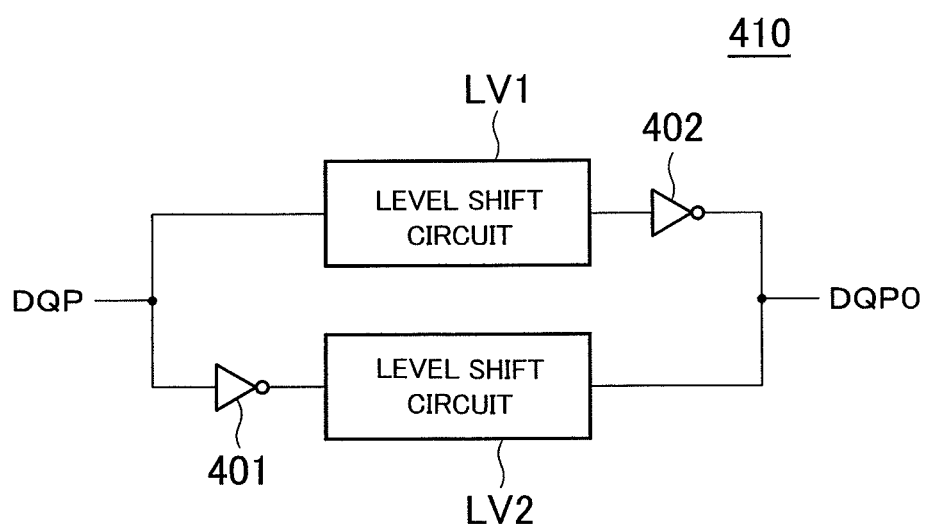
FIG. 8 is a block diagram showing the configuration of a level shift circuit unit 410 shown in FIG. 7.

Turning to FIG. 8, the level shift circuit unit 410 includes two level shift circuits LV1 and LV2, an inverter 401 which inverts the pull-up data DQP, and an inverter 402 which inverts an output signal of the level shift circuit LV1. The two level shift circuits LV1 and LV2 have the same circuit configuration. The pull-up data DQP without change of its logic is input to the level shift circuit LV1. An inverted signal of the pull-up data DQP, inverted by the inverter 401, is input to the level shift circuit LV2. The output signal of the level shift circuit LV1 inverted by the inverter 402 and an output signal of the level shift circuit LV2 are short-circuited and output as the pull-up data DQP0.

In the example shown in FIG. 8, the pull-up data DQP is simply input to the level shift circuit LV1. However, input circuits with any circuit configuration may be arranged in the stage prior to the level shift circuits LV1 and LV2 as long as complementary input signals are supplied to the level shift circuits LV1 and LV2. Similarly, in the example shown in FIG. 8, the output signal of the level shift circuit LV2 is simply short-circuited with the output signal of the inverter 402. However, output circuits with any circuit configuration may be arranged in the stage subsequent to the level shift circuits LV1 and LV2 as long as the complementary output signals output from the level shift circuits LV1 and LV2 are converted into in-phase signals before short-circuited.

Figure 9A:
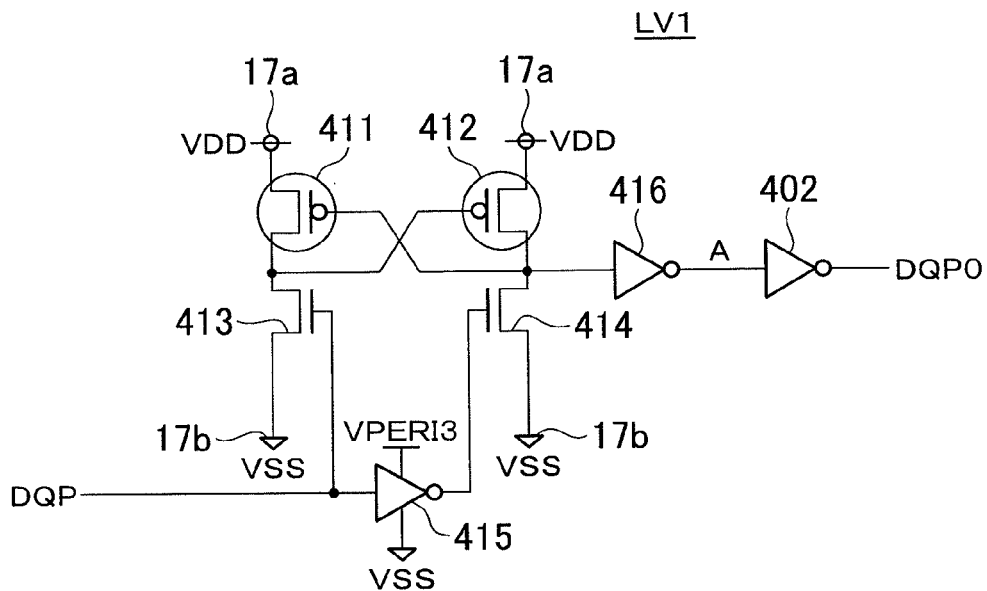
FIG. 9A is a circuit diagram of a level shift circuit LV1 shown in FIG. 8.

Turning to FIG. 9A, the level shift circuit LV1 includes P-channel MOS transistors 411 and 412 and N-channel MOS transistors 413 and 414. The transistors 411 and 412 are connected to the VDD line 17a at their sources and are cross-coupled with each other. The transistors 413 and 414 are connected to the VSS line 17b at their sources and are connected in series to the transistors 411 and 412, respectively. The pull-up data DQP is simply supplied to a gate electrode of the transistor 413. The pull-up data DQP is supplied to a gate electrode of the transistor 414 through an inverter 415. The level-shifted output signal is taken out from a node between the transistors 412 and 414, and output as the pull-up data DQP0 through inverters 416 and 402.

Figure 9B:
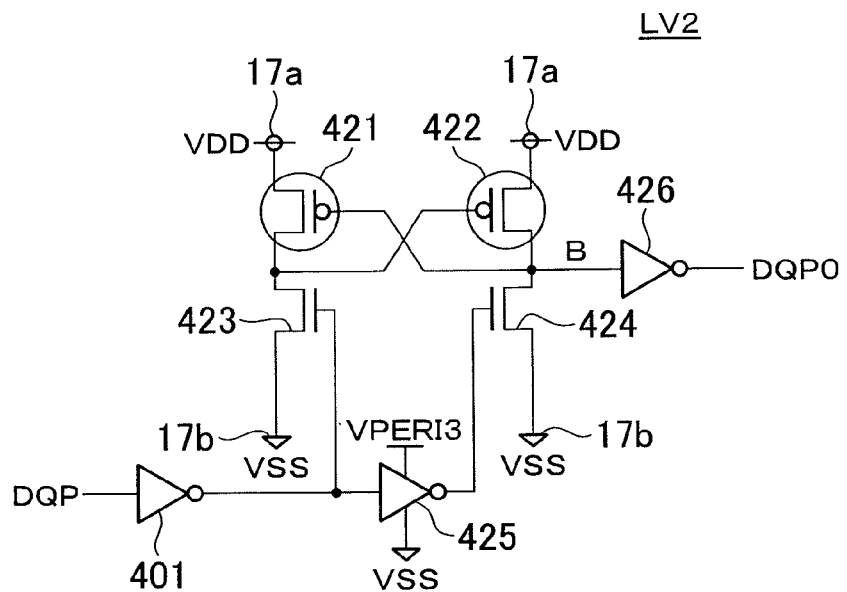
FIG. 9B is a circuit diagram of a level shift circuit LV2 shown in FIG. 8.

Turning to FIG. 9B, the level shift circuit LV2 has exactly the same circuit configuration as the level shift circuit LV1. More specifically, the level shift circuit LV2 includes P-channel MOS transistors 421 and 422 and N-channel MOS transistors 423 and 424. The transistors 421 and 422 are connected to the VDD line 17a at their sources and are cross-coupled with each other. The transistors 423 and 424 are connected to the VSS line 17b at their sources and are connected in series to the transistors 421 and 422, respectively. The pull-up data DQP is supplied to a gate electrode of the transistor 423 through the inverter 401. The pull-up data DQP is supplied to a gate electrode of the transistor 424 through the inverters 401 and 425. The level-shifted output signal is taken out from the node between the transistors 422 and 424, and output as the pull-up data DQP0 through an inverter 426.

As shown in FIG. 8, the output signal of the level shift circuit LV2 and the output signal of the level shift circuit LV1 through the inverter 402 are short-circuited. This synthesizes the output signals of the level shift circuits LV1 and LV2, so that the pull-up data DQP0 has a composite waveform.

Since the level shift circuit unit 410 includes the two level shift circuits LV1 and LV2, the number of elements is twice that of an ordinary level shift circuit. Each element, however, need only have half the size in an ordinary level shift circuit because the two level shift circuits LV1 and LV2 operate in parallel. Despite twice the number of elements, the occupied area on the chip is almost the same as with an ordinary level shift circuit.

Figure 10:
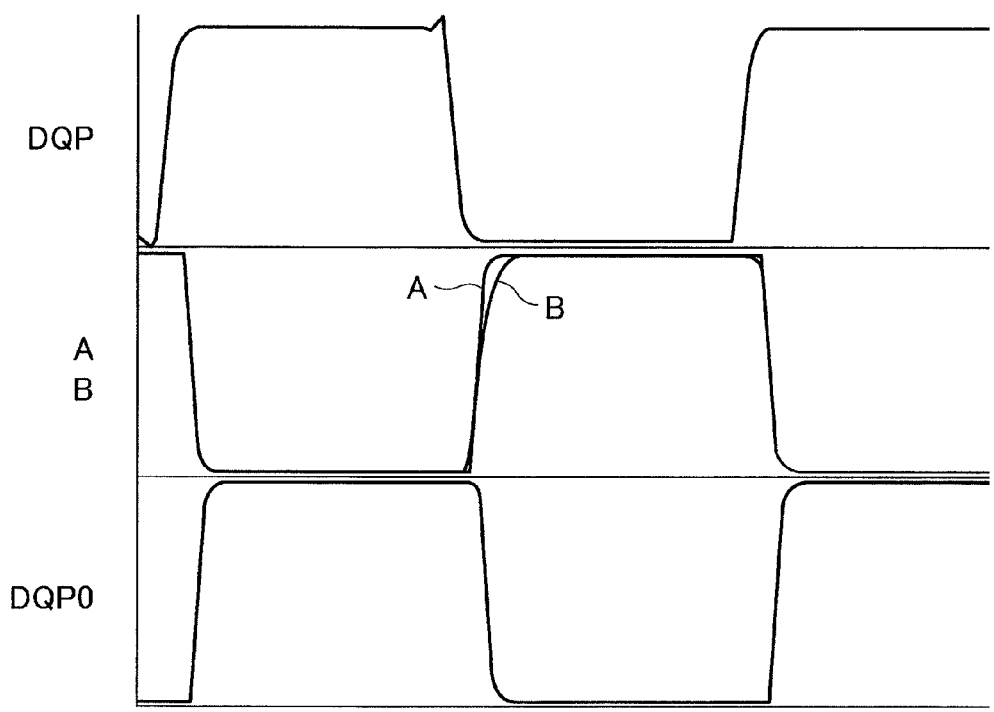
FIG. 10 is a waveform chart showing the operation of the level shift circuit unit 410.

Turning to FIG. 10, signals A and B are internal signals of the level shift circuits LV1 and LV2, respectively. As shown in FIG. 9, the signal A represents an output level of the inverter 416. The signal B represents a level of a node between the transistors 422 and 424. As shown in FIG. 10, when the pull-up data DQP changes from a high level to a low level, both the signals A and B change from a low level to a high level at slightly different slew rates. Specifically, the signal A rises more sharply than the signal B.

The signals A and B are passed through the inverters 402 and 426, respectively, and then short-circuited. The two signals having different slew rates are thereby synthesized into a steeper waveform. Similar synthesis also takes place when the pull-up data DQP changes from a low level to a high level. The input pull-up data DQP and the output pull-up data DUO therefore have almost the same duty cycles. Since the signals A and B having different slew rates are passed through the respective inverters 402 and 426 before short-circuited, no through current will flow if fan-out and other factors of the inverters 423 and 426 are appropriately designed.

Figure 11:
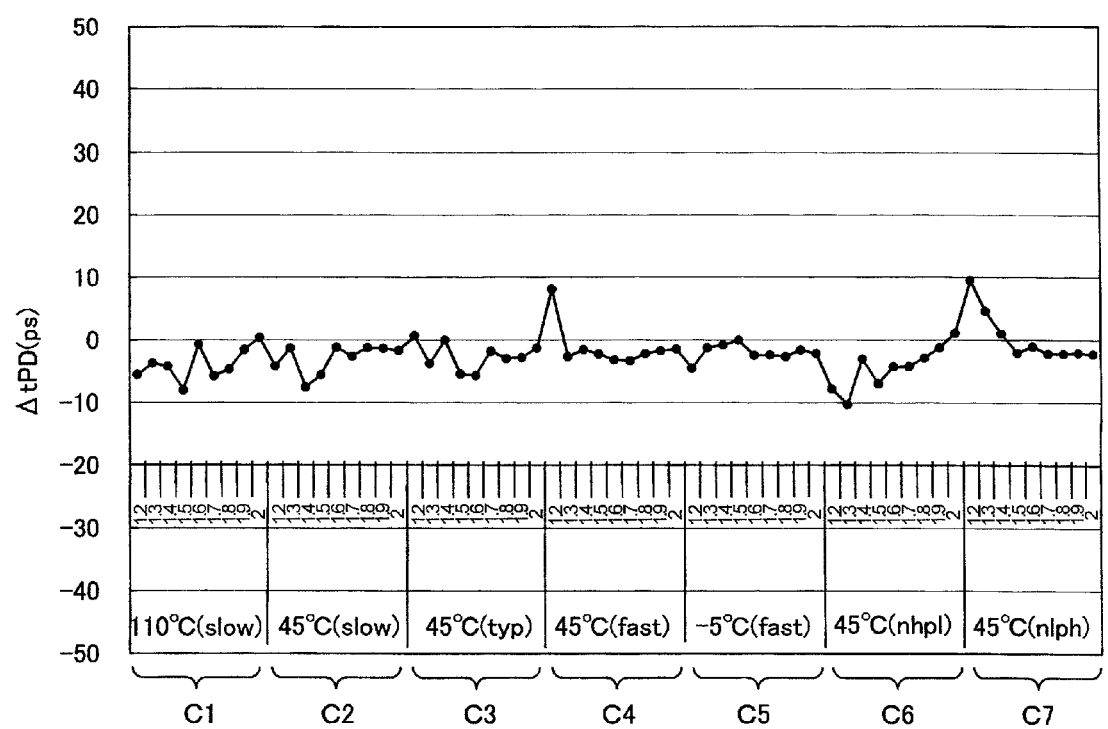
FIG. 11 is a simulation result showing the relationship between a difference $\Delta tPD$ in delay time and the external power supply potential VDD when using the level shift circuit unit 410 shown in FIG. 8.

Turning to FIG. 11, the difference ΔtPD represents a difference between a delay time at the rise and a delay time at the fall of the pull-up data DQP.

The condition C1 shown in FIG. 11 refers to a case where the ambient temperature is 110° C. and the transistor threshold is higher than a designed value due to process variations. That is, the transistor in condition C1 operates slower speed compared with a typical speed. The condition C2 refers to a case where the ambient temperature is 45° C. and the transistor threshold is higher than a designed value due to process variations. The condition C3 refers to a case where the ambient temperature is 45° C. and the transistor threshold is as designed. That is, the transistor in condition C3 operates at a typical speed. The condition C4 refers to a case where the ambient temperature is 45° C. and the transistor threshold is lower than a designed value due to process variations. That is, the transistor in condition C4 operates faster speed compared with a typical speed. The condition C5 refers to a case where the ambient temperature is −5° C. and the transistor threshold is lower than a designed value due to process variations. The condition C6 refers to a case where the ambient temperature is 45° C., the N-channel MOS transistors have a threshold higher than a designed value, and the P-channel MOS transistors have a threshold lower than a designed value due to process variations. The condition C7 refers to a case where the ambient temperature is 45° C., the N-channel MOS transistors have a threshold lower than a designed value, and the P-channel MOS transistors have a threshold higher than a designed value due to process variations.

In each of the conditions C1 to C7, the leftmost value is for a situation when the external power supply potential VDD is 1.2 V. The rightmost value is for a situation when the external power supply potential VDD is 2.0 V. The values therebetween are at potential pitches of 0.1 V.

As shown in FIG. 11, it can be seen that the use of the level, shift circuit unit 410 according to the present embodiment brings the difference ΔtPD between the delay time at the rise and the delay time at the fall of the pull-up data DQP close to zero. The tendency is little affected by the level of the external power supply potential VDD, the temperature condition, or the process condition.

Figure 12:
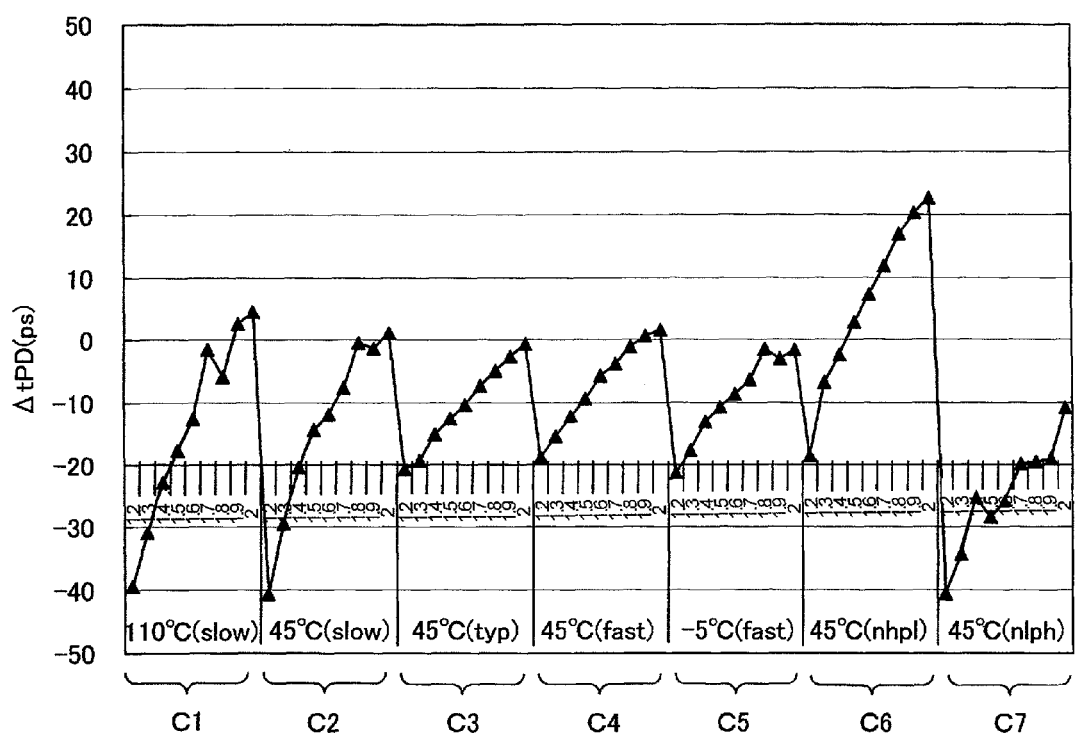
FIG. 12 is a simulation result showing the relationship between the time difference $\Delta tPD$ and the external power supply potential VDD according to a comparative example.

The simulation result shown in FIG. 12 is for the case of using only one of the level shift circuits LV1 and LV2. It should be noted that the transistor sizes are adjusted to approximately twice in order to provide the same measurement condition as in FIG. 11. In other respects, the measurement condition is the same as in FIG. 11. As shown in FIG. 12, it can be seen that the time difference ΔtPD according to the comparative example has high VDD dependence. The tendency varies with the temperature condition and the process condition.

While the description has dealt with the level shift circuit unit 410, the level shift circuit unit 420 can also provide the foregoing effect since the level shift circuit unit 420 has exactly the same circuit configuration as that of the level shift circuit unit 410. As shown in FIG. 7, the pull-up data DQP0 output from the level shift circuit units 410 is input to the impedance control circuit 510 as pull-up data DQP1 through the gate circuits 431 and 432. The pull-down data DQN0 output from the level shift circuit units 420 is input to the impedance control circuit 510 as pull-down data DQN1 through the inverters 441 and 442.

Figure 13:
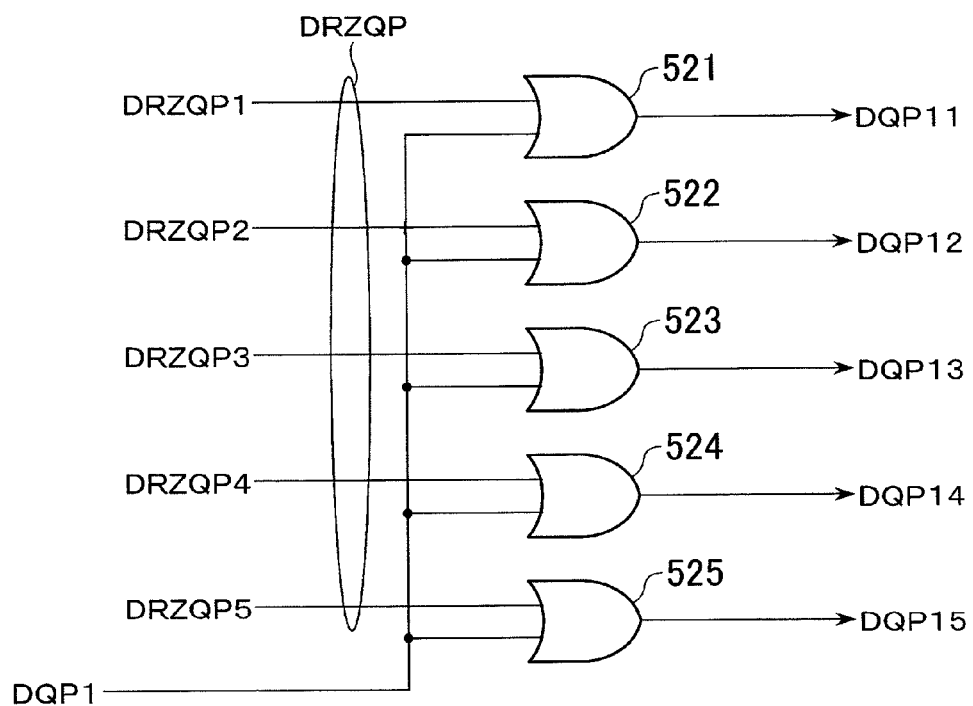
FIG. 13 is a circuit diagram of an impedance control circuit 510 shown in FIG. 7.
Figure 13:
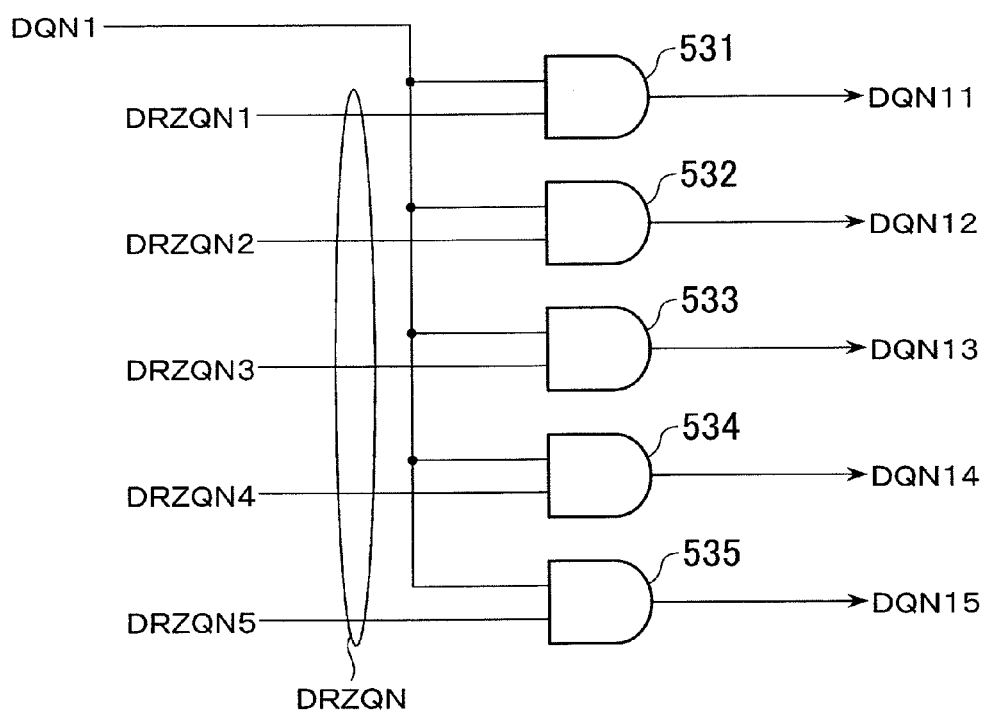

Turning to FIG. 13, the impedance control circuit 510 includes five OR circuits 521 to 525 (pull-up logic circuits) and five AND circuits 531 to 535 (pull-down logic circuits). The pull-up data DQP1 from the level shift circuit unit 410 is supplied to the OR circuits 521 to 525 in common. Bits DRZQP1 to DRZQP5 of a pull-up impedance adjustment code DRZQP are also supplied to the OR circuits 521 to 525, respectively. The pull-down data DQN1 from the level shift circuit unit 420 is supplied to the AND circuits 531 to 535 in common. Bits DRZQN1 to DRZQN5 of a pull-down impedance adjustment code DRZQN are also supplied to the AND circuits 531 to 535, respectively. The pull-up impedance adjustment code DRZQP and the pull-down impedance adjustment code DRZQN are signals that constitute the impedance code ZQCODE. The pull-up impedance adjustment code DRZQP and the pull-down impedance adjustment code DRZQN are supplied from the calibration circuit 66 shown in FIG. 1.

Outputs signals of the OR circuits 521 to 525, or pull-up data DQP11 to DQP15, and output signals of the AND circuits 531 to 535, or pull-down data DQN11 to DQN15, are supplied to the output buffer 501.

Figure 14:
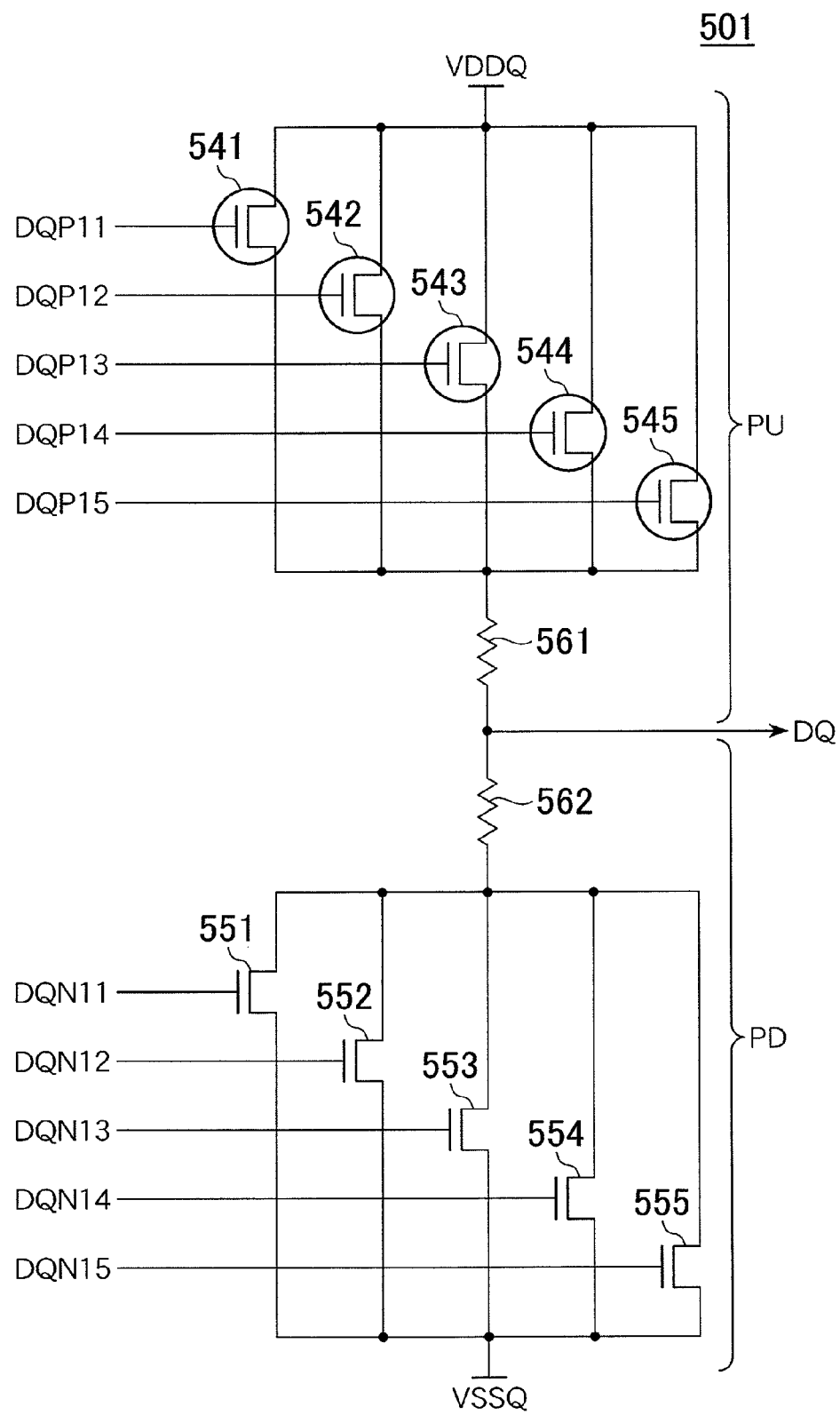
FIG. 14 is a circuit diagram of an output buffer 501 shown in FIG. 7.

Turning to FIG. 14, the output buffer 501 includes five P-channel MOS transistors 541 to 545 which are connected in parallel, and five N-channel MOS transistors 551 to 555 which are connected in parallel. Sources of the P-channel MOS transistors 541 to 545 are connected to the VDDQ line 17c. Sources of the N-channel MOS transistors 551 to 555 are connected to the VSSQ line 17d. Resistors 561 and 562 are connected in series between the transistors 541 to 545 and the transistors 551 to 555. A node between the resistors 561 and 562 is connected to the data input/output terminal 14.

The pieces of pull-up data DQP11 to DQP15 are supplied to gates of the transistors 541 to 545, respectively. The pieces of pull-down data DQN11 to DQN15 are supplied to gates of the transistors 551 to 555, respectively. Consequently, the ten transistors included in the output buffer 501 are individually controlled ON/OFF by the ten pieces of data DQP11 to DQP15 and DQN11 to DQN15.

The transistors 541 to 545 and the resistor 561 included in the output buffer 501 constitute a pull-up circuit PU. The transistors 551 to 555 and the resistor 562 included in the output buffer 501 constitute a pull-down circuit PD. The pull-up circuit PU and the pull-down circuit PD are designed to have a desired impedance when conducting. Transistors can vary in ON resistance depending on the manufacturing condition as well as ambient temperature and power supply voltage during operation. It is therefore not always possible to provide a desired impedance. To actually provide an impedance of desired value, the number of transistors to turn ON needs to be adjusted. The parallel circuits of the plurality of transistors are used for that purpose.

The impedance can be finely adjusted over a wide range by giving respective different W/L ratios (gate width/gate length ratios) to the plurality of transistors constituting a parallel circuit, with weights of powers of two in particular. In view of this, in the present embodiment, the transistors 542 to 545 are given W/L ratios of 2WLp, 4WLp, 8WLp, and 16WLp, respectively, where 1WLp is a W/L ratio of the transistor 541. Using the pull-up impedance adjustment code DRZQP, the transistor(s) to turn ON can be appropriately selected to fix an ON resistance of the pull-up circuit PU to a desired impedance regardless of variations due to the manufacturing condition and changes in temperature.

As with the transistors 541 to 545, it is also preferred that the transistors 551 to 555 have W/L ratios with weights of powers of two in particular. Specifically, the transistors 552 to 555 are given W/L ratios of 2WLn, 4WLn, 8WLn, and 16WLn, respectively, where 1WLn is a W/L ratio of the transistor 551. Using the pull-down impedance adjustment code DRZQN, the transistor(s) to turn ON can be appropriately selected to fix an ON resistance of the pull-down circuit PD to a desired impedance regardless of variations due to the manufacturing condition and changes in temperature.

The configuration of the semiconductor device 10 according to the present embodiment has been described so far. Since the semiconductor device 10 according to the present embodiment uses the level shift block 400 that has little difference between the rising and falling characteristics, the read data DQ and the strobe signal DQS can be output with improved signal quality. It is therefore possible to insert the level shift circuit units 410 and 420 into the paths of the signals that are adjusted in timing by the multiplexer 300 (pull-up data DQP and pull-down data DQN). This means that the circuits operating on the external voltage VDD can be reduced further to reduce power consumption and lessen the effect of variations in the external voltage VDD.

More specifically, if the signals adjusted in timing by the multiplexer 300 are subjected to level shifting to change in duty cycle, such a change is not able to be corrected by the DLL circuit 100. Level shift circuits having a large difference between rising and falling characteristics therefore can only be arranged in a stage prior to the multiplexer. Such arrangement leads to increased power consumption. In contrast, in the semiconductor device 10 according to the present embodiment, the level shift circuits can be arranged in a stage subsequent to the multiplexer to achieve the foregoing effects.

In the present embodiment, the clock dividing circuit 200 operates on the internal power supply voltage VPERI2, and the multiplexer 300 operates on the internal power supply voltage VPERI3. Such configuration prevents the interaction of noise occurring from the circuit blocks. In addition, the internal power supply voltages VPERI2 and VPERI3 are separated from the internal power supply voltage VPERI which is used in other peripheral circuits such as the FIFO circuit 65. Consequently, the effect of noise is also reduced between other peripheral circuits and the clock dividing circuit 200 and multiplexer 300.

It is apparent that the present invention is not limited to the above embodiments, but may be modified and changed without departing from the scope and spirit of the invention.

For example, the level shift circuits LV1 and LV2 are not limited to the circuit configuration shown in FIGS. 9A and 9B, respectively. Other circuit configurations may be employed. For example, the circuit configuration shown in FIG. 15 may be used. The circuit configuration shown in FIG. 16 may be used.

Figure 15:
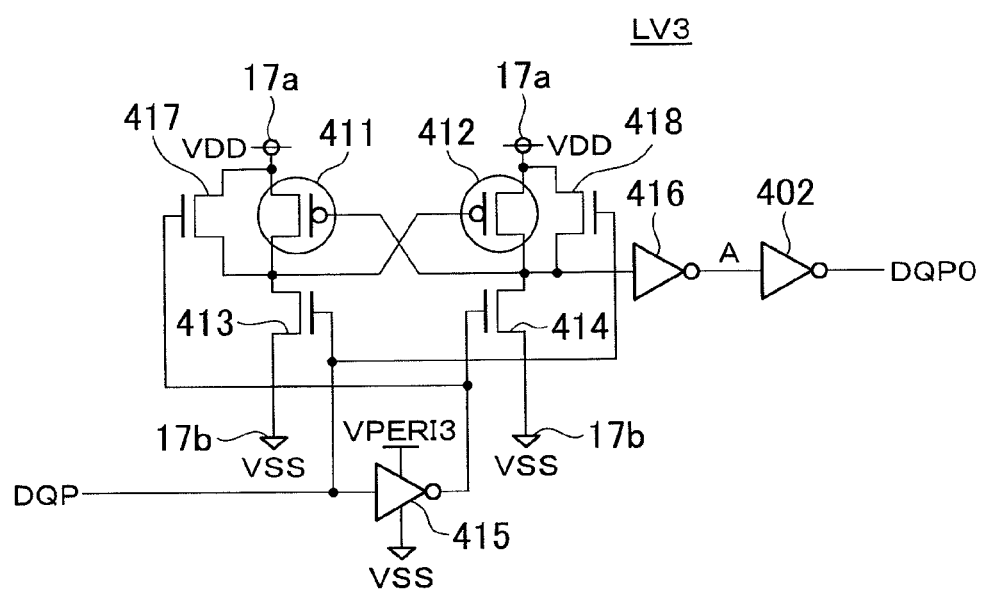
FIG. 15 is a circuit diagram of the level shift circuit LV3 according to a modification.

The level shift circuit LV3 shown in FIG. 15 differs from the level shift circuit LV1 shown in FIG. 9A in that there are additional N-channel MOS transistors 417 and 418. The transistor 417 is connected in parallel with the transistor 411. A gate electrode of the transistor 417 is connected to that of the transistor 414. The transistor 418 is connected in parallel with the transistor 412. A gate electrode of the transistor 418 is connected to that of the transistor 413. The level shift circuit LV3 having such a configuration can be used to further reduce the difference between the rising and falling characteristics.

Figure 16:
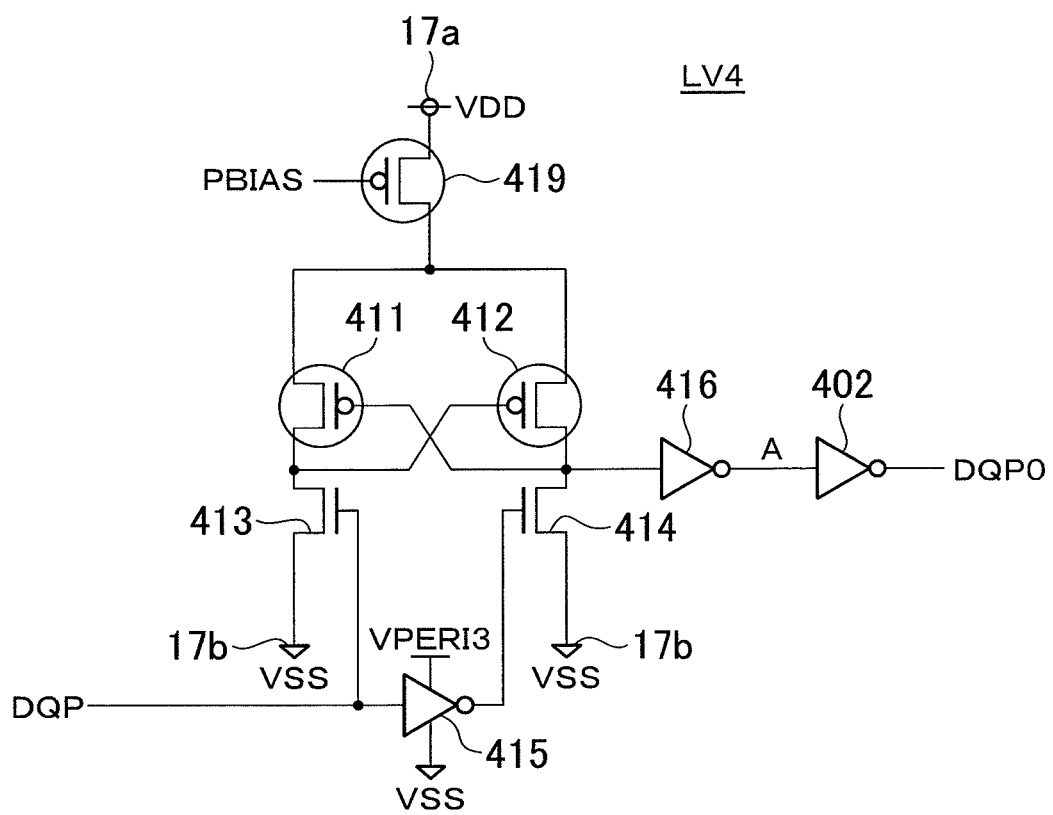
FIG. 16 is a circuit diagram of the level shift circuit LV3 according to another modification.

The level shift circuit LV4 shown in FIG. 16 differs from the level shift circuit LV1 shown in FIG. 9A in that there is an additional P-channel MOS transistor 419. The transistor 419 is connected between the common source VDD of the transistors 411 and 412 and the VDD line 17a. A bias signal PBIAS is supplied to a gate electrode of the transistor 419. The level shift circuit LV4 having such a configuration can be used to improve the signal transition rate.

In the present invention, it is not absolutely necessary to use the respective different power supply circuits 81 to 84 to generate the internal power supply potentials VPERI, VPERI2, VPERI3, and VPERDL and separate the internal power supply potentials in the semiconductor device.

What is claimed is:

1. A semiconductor device comprising:
   first and second level shift circuit units, each level shift circuit unit comprising:
      first and second level shift circuits;
      an input circuit that supplies complementary input signals to the first and second level shift circuits, respectively; and
      an output circuit that converts complementary output signals supplied from the first and second level shift circuits into in-phase signals and short-circuits the in-phase signals;
   an impedance control circuit that is coupled to generate output signals from short-circuited in-phase signals from each of the first and second level shift circuit units; and
   an output buffer having an adjustable impedance that is coupled to receive the output signals from the impedance control circuit.

2. The semiconductor device as claimed in claim 1, wherein
   each of the first and second level shift circuits includes first and second transistors of first conductivity type that are cross-coupled to each other, and third and fourth transistors of second conductivity type that are coupled in series to the first and second transistors, respectively,
   each of the first and second transistors has a power supply node coupled to a first power supply line,
   each of the third and fourth transistors has a power supply node coupled to a second power supply line,
   each of the third and fourth transistors has a control node supplied with an associated one of the complementary input signals,
   one of the complementary output signals is output from one of a connecting node between the first and third transistors and a connecting node between the second and fourth transistors included in the first level shift circuit, and
   the other of the complementary output signals is output from one of a connecting node between the first and third transistors and a connecting node between the second and fourth transistors included in the second level shift circuit.

3. The semiconductor device as claimed in claim 2, wherein
   each of the first and second level shift circuits further includes fifth and sixth transistors of the second conductivity type that are coupled in parallel with the first and second transistors, respectively,
   the control node of the third transistor is short-circuited to that of the sixth transistor, and
   the control node of the fourth transistor is short-circuited to that of the fifth transistor.

4. The semiconductor device as claimed in claim 2, further comprising:
   a DLL circuit that generates a first internal clock signal based on an external clock signal;
   a clock dividing circuit that generates second and third internal clock signals having different phases based on the first internal clock signal; and
   a multiplexer that outputs second and third internal data signals based on a first internal data signal in synchronization with one of the second and third clock signals,
   wherein the level shift circuit unit is inserted into each of signal paths that transmit the second and third internal data signals, respectively.

5. The semiconductor device as claimed in claim 4, wherein the multiplexer outputs fourth and fifth internal data signals in synchronization with the other of the second and third clock signals based on the sixth internal data signal that is supplied subsequent to the first internal data signal.

6. The semiconductor device as claimed in claim 4, where the output buffer comprises:
   a data output terminal;
   a first output transistor of the first conductivity type that is coupled between the data output terminal and a third power supply line; and
   a second output transistor of the second conductivity type that is coupled between the data output terminal and a fourth power supply line, wherein
   the first output transistor is controlled by the second internal data signal that is passed through the level shift circuit unit, and
   the second output transistor is controlled by the third internal data signal that is passed through the level shift circuit unit.

7. The semiconductor device as claimed in claim 6, further comprising first to fourth power supply terminals that are coupled to the first to fourth power supply lines, respectively, wherein
   the first and third power supply terminals are supplied with substantially the same potentials,
   the second and fourth power supply terminals are supplied with substantially the same potentials,
   the first and third power supply lines are separated from each other in the semiconductor device, and
   the second and fourth power supply lines are separated from each other in the semiconductor device.

8. The semiconductor device as claimed in claim 4, further comprising a plurality of power supply circuits each generating an internal power supply voltage,
   wherein the internal power supply voltage supplied to the clock dividing circuit and the internal power supply voltage supplied to the multiplexer are generated by respective different power supply circuits and are separated from each other in the semiconductor device.

9. The semiconductor device as claimed in claim 8, further comprising:
   a memory cell array; and
   a data transfer circuit that supplies the first internal data signal read from the memory cell array to the multiplexer, wherein
   the plurality of power supply circuits includes first to third power supply circuits that generate first to third internal power supply voltages based on an external power supply voltage, respectively,
   the first to third internal power supply voltages have substantially the same level and are separated from each other in the semiconductor device, the data transfer circuit operates on the first internal power supply voltage, the clock dividing circuit operates on the second internal power supply voltage, and the multiplexer operates on the third internal power supply voltage.

10. The semiconductor device as claimed in claim 9, further comprising a fourth power supply circuit that generates a fourth internal power supply voltage based on the external power supply voltage, wherein the first to fourth internal power supply voltages have substantially the same level and are separated from each other in the semiconductor device, and the DLL circuit includes a delay line that operates on the fourth internal power supply voltage.

11. The semiconductor device as claimed in claim 10, further comprising a clock tree circuit that supplies the first internal clock signal generated by the DLL circuit to the clock dividing circuit, wherein the clock tree circuit operates on the second internal power supply voltage.

12. The semiconductor device as claimed in claim 1, wherein the first level shift circuit has substantially the same circuit configuration as that of the second level shift circuit.

13. A device comprising:
an input terminal;
an output terminal;
a first level shift circuit including an input node, that is coupled to the input terminal, and an output node;
a second level shift circuit including an output node, that is coupled to the output terminal, and an input node;
a first inverting circuit coupled between the output node of the first level shift circuit and the output terminal;
a second inverting circuit coupled between the input terminal and the input node of the second level shift circuit;
an impedance control circuit that is coupled to the output terminal for generating output signals therefrom; and
an output buffer having an adjustable impedance that is coupled to receive the output signals from the impedance control circuit.

14. The device as claimed in claim 13, wherein each of the first and second level shift circuits comprises:

a first transistor coupled between a first power line and a first circuit node and including a control electrode coupled to a second circuit node, the second circuit node being coupled to the output node;

a second transistor coupled between the first power line and the second circuit node and including a control electrode coupled to the first circuit node;

a third transistor coupled between the first circuit node and a second power line and including a control electrode coupled to the input node;

a fourth transistor coupled between the second circuit node and the second power line and including a control electrode; and a first inverter coupled between the input node and the control electrode of the fourth transistor.

15. The device as claimed in claim 14, wherein each of the first and second level shift circuit further comprises a second inverter inserted between the second circuit node and the output node.

16. The device as claimed in claim 14, wherein each of the first and second level shift circuit further comprises fifth transistor coupled between the first power line and the first circuit node and including a control electrode coupled to the control electrode of the fourth transistor and a sixth transistor coupled between the first power line and the second circuit node and including a control electrode coupled to the control electrode of the third transistor.

17. The device as claimed in claim 16, wherein each of the first and second level shift circuit further comprises a second inverter inserted between the second circuit node and the output node.

18. The device as claimed in claim 14, wherein each of the first and second level shift circuits further comprises a fifth transistor intervening between the first power line and each of the first and second transistors.

19. The device as claimed in claim 18, wherein each of the first and second level shift circuit further comprises a second inverter inserted between the second circuit node and the output node.

20. The device as claimed in claim 14, wherein the first inverter operates on a power voltage that is different from a voltage supplied to the first power line.

* * * * *